(12) United States Patent
Wakabayashi

(10) Patent No.: US 8,012,650 B2
(45) Date of Patent: Sep. 6, 2011

(54) SEMICONDUCTOR DEVICE MANUFACTURING METHOD AND WAFER

(75) Inventor: Toshihiro Wakabayashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 680 days.

(21) Appl. No.: 11/350,017

(22) Filed: Feb. 9, 2006

(65) Prior Publication Data

US 2007/0054199 A1    Mar. 8, 2007

(30) Foreign Application Priority Data

Sep. 2, 2005    (JP) .................................. 2005-254728

(51) Int. Cl.
    *G03F 1/00*    (2006.01)
(52) U.S. Cl. .............................. 430/5; 430/311; 430/394
(58) Field of Classification Search .................. 430/311, 430/5, 394; 257/508
    See application file for complete search history.

(56) References Cited

U.S. PATENT DOCUMENTS

| | | | |
|---|---|---|---|
| 2002/0100012 A1* | 7/2002 | Sutani et al. | 716/21 |
| 2004/0150070 A1* | 8/2004 | Okada et al. | 257/508 |
| 2004/0169258 A1* | 9/2004 | Iijima | 257/620 |
| 2004/0188699 A1* | 9/2004 | Kameyama et al. | 257/99 |

FOREIGN PATENT DOCUMENTS

| | | |
|---|---|---|
| JP | 62-244130 A | 10/1987 |
| JP | 10-50777 | 2/1998 |
| JP | 2002-176140 A | 6/2002 |
| JP | 2002-280293 | 9/2002 |
| JP | 2004-119848 A | 4/2004 |
| JP | 2004-253564 A | 9/2004 |

OTHER PUBLICATIONS

"Japanese Office Action", Partial English-language translation, mailed Jul. 14, 2009 in reference to JP App. No. 2005-254728.

* cited by examiner

*Primary Examiner* — Mark F Huff
*Assistant Examiner* — Rashid Alam
(74) *Attorney, Agent, or Firm* — Fujitsu Patent Center

(57) ABSTRACT

A semiconductor device manufacturing method allowing effective inspection at low cost of a wafer having formed thereon chips. When forming chips on the wafer, a reticle having formed thereon chip patterns, monitor element/circuit patterns and connection patterns is used according to a formation step of the chips. The reticle is constructed such that a part of the monitor element/circuit patterns and the connection patterns are formed in the inner side area of an outer peripheral dicing area and when exposing adjacent shot positions, the pattern is formed on a portion where no outer peripheral dicing areas overlap whereas no pattern is formed on a part of a portion where outer peripheral dicing areas overlap. When using the reticle, a circuit which surrounds the whole chip formation area can be formed with the chips. According to this circuit, extensive electric characteristics on the wafer can be simply measured in a short time, so that quality determination of the wafer can be effectively performed at low cost.

4 Claims, 11 Drawing Sheets

SEMICONDUCTOR DEVICE MANUFACTURING METHOD AND WAFER

CROSS-REFERENCE TO RELATED APPLICATIONS

This application is based upon and claims the benefits of priority from the prior Japanese Patent Application No. 2005-254728, filed on Sep. 2, 2005, the entire contents of which are incorporated herein by reference.

BACKGROUND OF THE INVENTION

1. Field of the Invention

The present invention relates to a semiconductor device manufacturing method, a wafer and a reticle. More particularly, the present invention relates to a semiconductor device manufacturing method using photolithography. The invention also pertains to a wafer and reticle used in manufacture of semiconductor devices.

2. Description of the Related Art

In manufacture of semiconductor devices, a number of chips (semiconductor devices) are formed on one wafer. These chips are cut into individual dice. Among the diced chips, only nondefective chips are conveyed to a subsequent packaging step. Before the dicing, there is normally inspected whether or not each chip formed on the wafer or the wafer itself is a nondefective product. For a method for performing quality determination of chips or a wafer before the dicing, there is disclosed a method for measuring electric characteristics of a part or all of the chips formed on the wafer to perform the quality determination or a method for measuring electric characteristics of a monitor element or monitor circuit (referred to as a "monitor element/circuit") previously formed with chips on the wafer to perform the quality determination based on the measurement results.

In connection with the determination method like this, there is conventionally proposed a measuring method of the electric characteristics (see, Japanese Unexamined Patent Publication No. Hei 10-50777). That is, when bringing a probe needle of a tester into contact with an electric pad on a chip to measure the electric characteristics, in order to prevent the chip from being damaged due to deviation in a contact position of the probe needle or due to biting of the probe needle into the electric pad, the contact position or biting depth of the prove needle is adjusted before the contact of the prove needle with the electric pad while bringing the probe needle into contact with a monitor pad previously formed apart from the electric pad.

In addition, there is also proposed a method for forming a monitor element/circuit (see, Japanese Unexamined Patent Publication No. 2002-280293), in which a first reticle having formed thereon a chip pattern and a second reticle having formed thereon a pattern for a monitor element or for a monitor circuit (referred to as a "monitor element/circuit pattern) are used in an exposure step. In this proposal, the monitor element/circuit pattern of the second reticle is formed on a resist in an area served as a dicing line of a wafer. Further, after exposing a shot position through the first reticle, the resulting shot position is exposed through the second reticle. As a result, the first reticle gives shade to an area where the monitor element/circuit pattern is exposed later through the second reticle, and the second reticle gives shade to an area where the chip pattern is already exposed through the first reticle. That is, after exposing all of the shot positions through the first reticle, these resulting shot positions are alternately exposed through the second reticle. Thus, the chip pattern is formed on the resist of the wafer as well as the monitor element/circuit pattern is formed on the resist in the area served as the dicing line of the wafer.

However, in the quality determination of a wafer before dicing, the above-described method for measuring the respective electric characteristics of a part or all of the chips formed on the wafer has a problem that measurement is complicated, a long measuring time is required or an expensive measuring device is required. Further, the method has a problem that in a wafer state before dicing, measurement using a high frequency or measurement using a large current may be hardly performed on each chip.

On the contrary, the method for performing the quality determination of the wafer by measuring the electric characteristics of the monitor element/circuit formed with the chips has the following advantages. That is, the electric characteristics of the monitor element/circuit like this are easily measured normally. Further, the monitor element/circuit has a construction simpler than that of the chips. Therefore, this measurement method can be simply performed at low cost as compared with the method for measuring the chip itself.

However, when using this method, a monitor element/circuit is formed on a wafer in addition to chips originally required. Therefore, in order to obtain as many chips as possible from one wafer, an arrangement of the monitor element/circuit on the wafer must be taken notice of. For a method for arranging the monitor element/circuit on the wafer, the following methods are considered in addition to the above-described method for arranging the monitor element/circuit on a dicing line of the wafer, namely, between chips on the wafer. That is, a method for forming a part of chips as the monitor element/circuit, a method for installing at a plurality of positions of the wafer a block having formed thereon the monitor element/circuit, and a method for forming the monitor element/circuit within a chip product are considered.

However, also the method for thus performing quality determination by using the monitor element/circuit has the following problems.

For example, when measuring the electric characteristics of a part or all of the monitor elements/circuits appropriately arranged on the wafer as described above and performing the quality determination of the wafer based on the obtained measurement results, the measurement of as many monitor elements/circuits as possible which are formed in various areas on the wafer must be performed in order to increase determination accuracy. However, when measuring the electric characteristics of a number of monitor elements/circuits, a measuring time of course increases, for all that the measurement of the monitor element/circuit is relatively easy and the construction thereof is simple as compared with that of chips.

Further, when forming a number of the monitor elements/circuits on one wafer, depending on the construction or arrangement of the monitor elements/circuits, an area usable for chips may be reduced to result in reduction of the number of chips. This problem may be avoided by forming the monitor element/circuit on the dicing line as in the above-described example. However, when manufacturing a reticle for forming the monitor element/circuit apart from a reticle for forming a chip, the number of reticles increases. As a result, increase in a manufacturing cost of reticles and increase in the number of manufacturing steps thereof are induced to thereby finally increase in the chip cost.

SUMMARY OF THE INVENTION

In view of the foregoing, it is an object of the present invention to provide a semiconductor device manufacturing method capable of effectively manufacturing a high-quality semiconductor device at low cost.

It is another object of the present invention to provide a wafer of which quality determination before dicing can be easily performed.

It is yet another object of the present invention to provide a reticle usable for formation of a wafer of which quality determination before dicing can be easily performed.

To accomplish the above object, according to the present invention, there is provided a semiconductor device manufacturing method.

This manufacturing method comprises: a step of forming a semiconductor device on a wafer, wherein in an outer periphery of a formation area of the semiconductor device, a circuit is formed to surround the formation area.

To accomplish another object, according to the present invention, there is provided a wafer having formed thereon a semiconductor device. This wafer comprises: a semiconductor device, and a circuit formed in an outer periphery of a formation area of the semiconductor device so as to surround the formation area.

To accomplish yet another object, according to the present invention, there is provided a reticle used in formation of a semiconductor device. This reticle comprises: an area (a) having formed therein a pattern for forming a semiconductor device, and an area (b) in an outer periphery of the area (a), the area (b) being served as a dicing line on a wafer, wherein in the area (b) served as the dicing line, a pattern is formed and arranged such that when exposing adjacent positions, no exposure pattern having a perfect form is formed on a portion where the areas (b) overlap.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
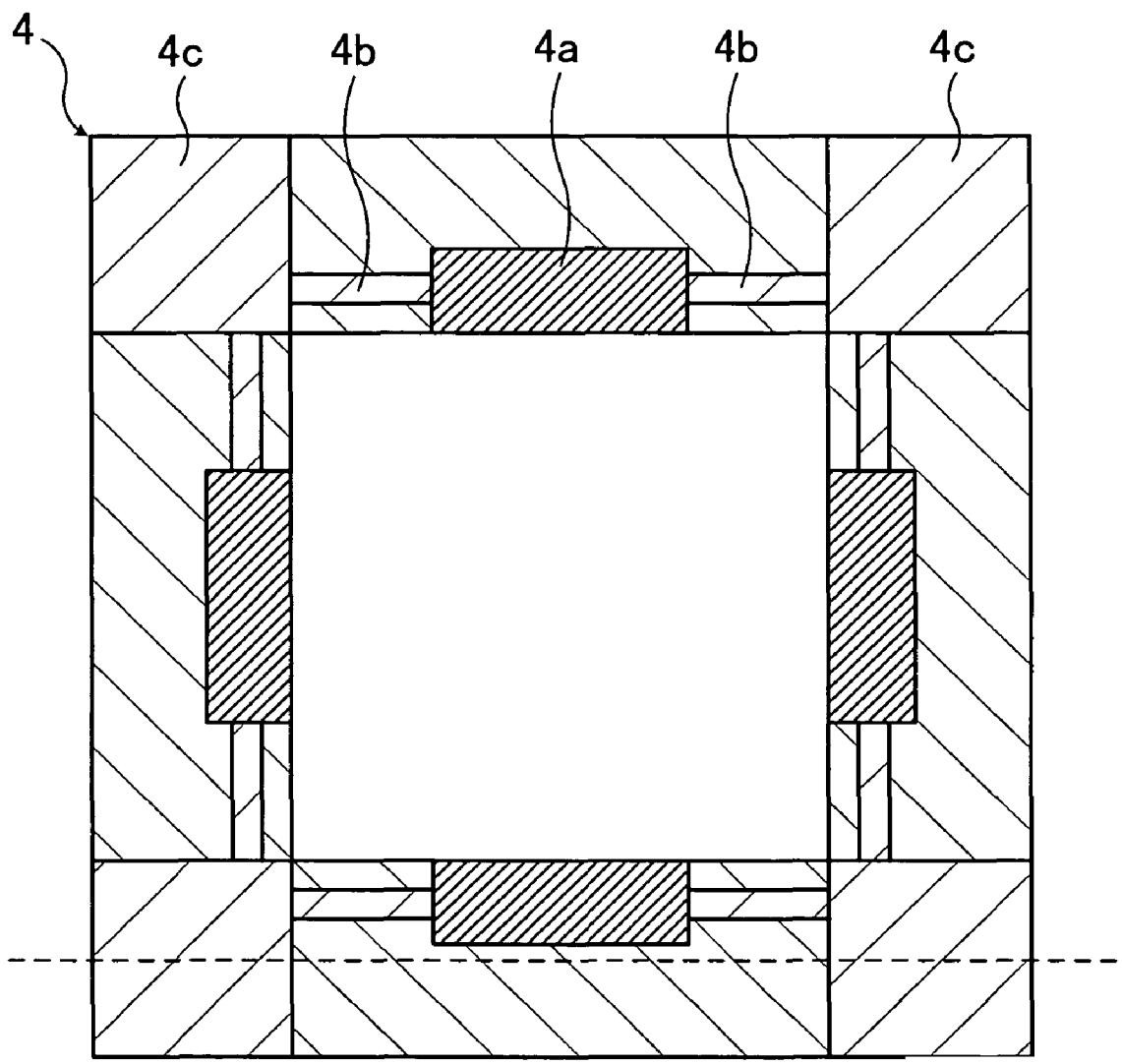
FIG. 1 is a schematic view showing one example of an outer peripheral dicing area.

Preferred embodiments of the present invention will be described below with reference to the accompanying drawings, wherein like reference numerals refer to like elements throughout.

Figure 2:
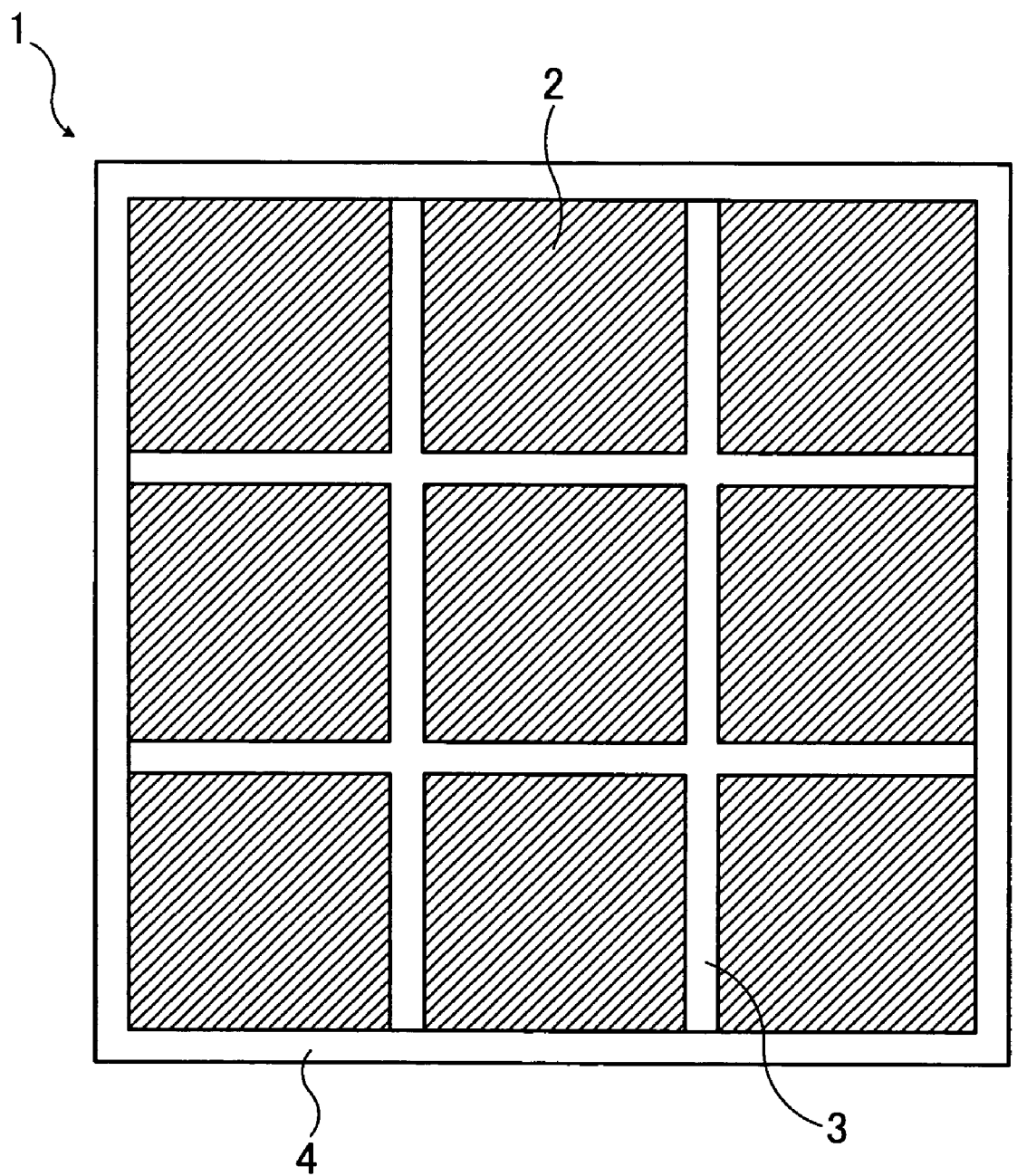
FIG. 2 shows a construction example of a reticle.

FIG. 2 shows a construction example of a reticle.

A reticle 1 exemplified in FIG. 2 has a total of 9 chip pattern formation areas (referred to as a "chip pattern area") 2 arranged lengthwise 3 areas and widthwise 3 areas. The respective chip pattern areas 2 within the reticle 1 are zoned by a dicing area (referred to as an "inner dicing area") 3 as a dicing line on a wafer. Further, in an outer periphery of the reticle 1, a dicing area (referred to as an "outer peripheral dicing area") 4 is formed to surround the whole chip pattern area 2. When performing exposure of a plurality of shot positions using the reticle 1, the area 4 is served as the dicing line for dicing adjacent chips between different shot positions. When thus performing exposure of the plurality of shot positions, the exposure is usually performed such that areas corresponding to the areas 4 overlap on the resist.

In the formation of chips, two or more reticles 1 described above are prepared according to the number of the chip formation steps. Further, the reticle 1 is of course designed such that a chip pattern formed on the reticle 1 or a monitor element/circuit pattern or connection pattern described later is prevented from falling off.

FIG. 1 is a schematic view showing one example of an outer peripheral dicing area.

The outer peripheral dicing area 4 of the reticle 1 has a monitor element/circuit area 4a in which a monitor element/circuit pattern for forming a monitor element/circuit is formed, and monitor element/circuit connection areas 4b and 4c in which a connection pattern for electrically connecting between monitor elements/circuits is formed. In a central area surrounded by the outer peripheral dicing area 4, the chip pattern area 2 and inner dicing area 3 shown in FIG. 2 are included (not shown in FIG. 1).

Herein, for the monitor element/circuit, for example, a resistor, inductor, capacitor, diode, transistor, inverter circuit and operational amplifier circuit can be used as described later. In the monitor element/circuit area 4a of the outer peripheral dicing area 4, various patterns are formed in response to the monitor element/circuit.

Herein, as shown in FIG. 1, the monitor element/circuit connection area 4c is formed in each of four corners of the outer peripheral dicing area 4, and the monitor element/circuit connection area 4b is formed for connecting between the area 4c and the monitor element/circuit area 4a.

On each of the reticles 1 used in each formation step of chips, a part or all of the monitor element/circuit patterns or of the connection patterns are formed together with the chip pattern such that the monitor element/circuit in a predetermined connection state is completed on the wafer in response to the formation of chips.

FIG. 1 shows a case where one reticle 1 has the monitor element/circuit area 4a and the monitor element/circuit connection areas 4b and 4c at the same time. On the reticle 1, a part or all of the monitor element/circuit patterns or of connection patterns are formed in response to the formation step of chips as described above. Therefore, the monitor element/circuit area 4a and the monitor element/circuit connection areas 4b and 4c are not necessarily required to be present on one reticle 1 at the same time.

In the reticle 1 having the construction like this, when using a negative resist as a resist during exposure, the monitor element/circuit connection areas 4b and 4c are used as light shading parts and an area (excluding the monitor element/circuit area 4a) other than the areas 4b and 4c is used as an opening part.

When viewing each side of the outer peripheral dicing area 4, the monitor element/circuit area 4a and the monitor element/circuit connection area 4b are formed in an inner side area of each side in the area 4, namely, formed to a central area surrounded by the outer peripheral dicing area 4. For example, the monitor element/circuit area 4a and the monitor element/circuit connection area 4b are formed in the inner side area than the center (in FIG. 1, the central position is shown only in one side by a broken line. The same is true in each side) of the outer peripheral dicing area 4. On the contrary, in the outer side area of each side in the area 4, for example, in the outer side area than the center of the outer peripheral dicing area 4, the monitor element/circuit area 4a and the monitor element/circuit connection area 4b are not formed.

In forming an exposure pattern on the resist using the reticle 1 like this, respective shot positions on the resist are exposed to allow areas corresponding to the outer peripheral dicing area 4 to overlap on the resist when exposing adjacent shot positions. Thus, an exposure pattern with a figure similar to a chip pattern, monitor element/circuit pattern and connection pattern formed in the central area and outer peripheral dicing area 4 of the reticle 1 is formed on the resist.

Figure 3:
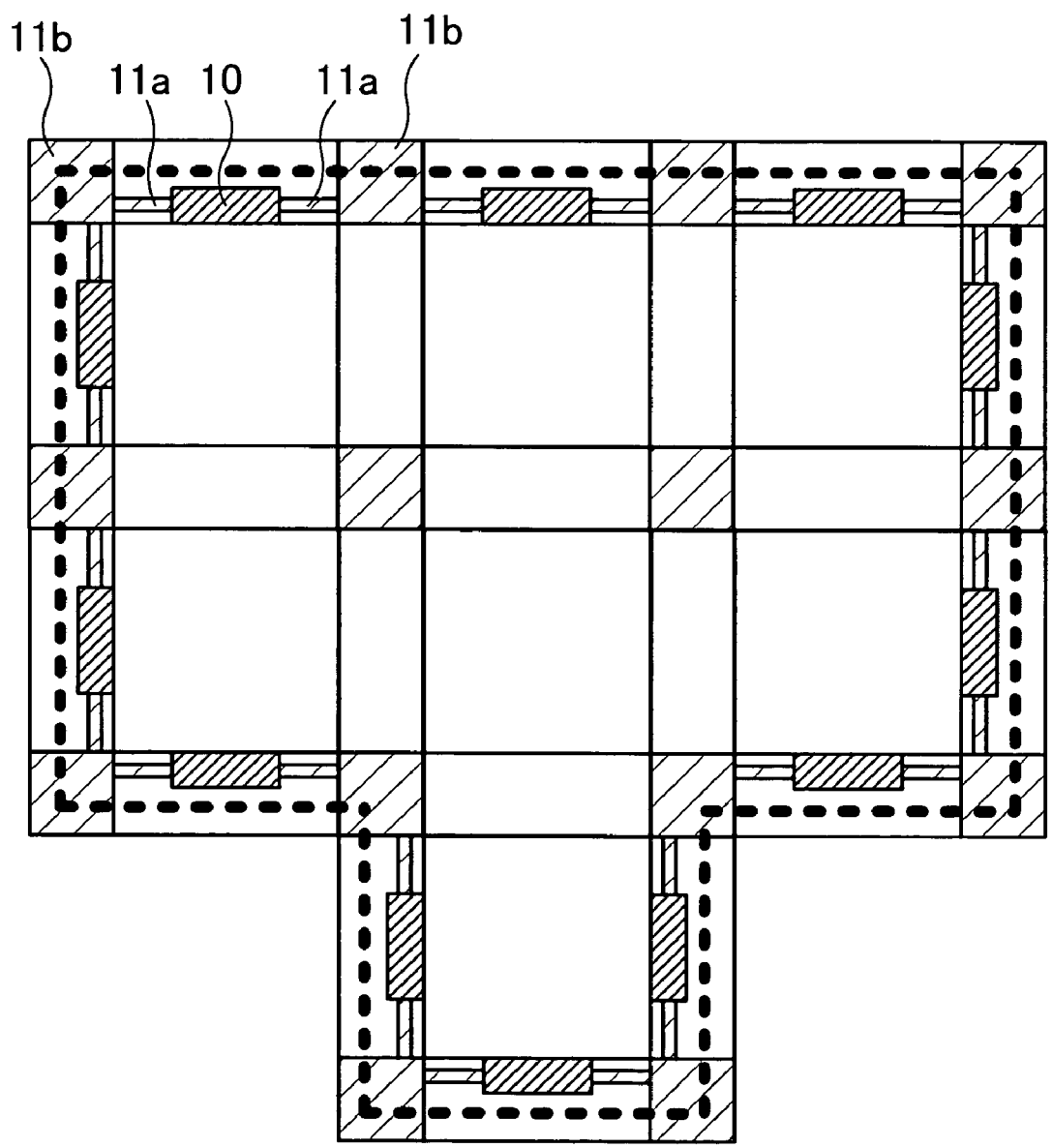
FIG. 3 is a schematic view showing one example of an exposure pattern formation position.

FIG. 3 is a schematic view showing one example of an exposure pattern formation position.

FIG. 3 shows an outline of the formation position of the exposure pattern finally obtained on the resist. Each pattern element constructing the exposure pattern shown in the figure is not necessarily formed by single exposure. Further, as described above, when using the negative resist and serving the monitor element/circuit connection areas 4b and 4c as the light shading part as well as serving an area (excluding the monitor element/circuit area 4a) other than the areas 4b and 4c as the opening part, shaded portions among the respective pattern elements are shaded as portions from which the resist is removed.

In a portion where the areas 4 of the reticle 1 do not overlap on the resist during exposure, namely, in the outer periphery of the whole shot position, a monitor element/circuit pattern 10 formed in the area 4a and a connection pattern 11a formed in the area 4b are exposed on the resist. Further, also each of connection patterns 11b in the four corners of the area 4 is exposed onto each shot position. On the contrary, in a portion where the areas 4 of the reticle 1 overlap with each other on the resist during exposure, namely, in a portion between the adjacent shot positions, the pattern 10 and the pattern 11a are not exposed on the resist.

This is because the monitor element/circuit pattern 10 and the connection pattern 11a are formed in the inner side area of each side in the outer peripheral dicing area 4, as shown in FIG. 1. That is, an area on the resist on which the patterns 10 and 11a are previously exposed, which corresponds to the area 4 inner side area, is exposed later by irradiation light from an outer side portion of the area 4. Further, onto an area on the resist previously exposed by irradiation light from the outer side portion of the area 4, even if an area corresponding to the area 4 inner side area overlaps later with the area, the patterns 10 and 11a are not exposed later.

Thus, the reticle 1 has a pattern arrangement such that during exposure, no exposure pattern formed on the reticle 1 is exposed in a perfect form (including a similar figure) on the resist portion where the dicing line areas 4 overlap.

As a result, the monitor element/circuit pattern 10 and the connection patterns 11a and 11b are exposed on the resist to surround the central chip area as indicated by a broken line in FIG. 3. Accordingly, when forming the monitor element/circuit or the wiring using the thus obtained exposure pattern, there can be formed in the outer periphery of the chip area on the wafer a circuit which surrounds the chip area.

In general, defective chips generated within the wafer are more distributed in an outer side area than inner side area of the wafer in many cases. Therefore, when measuring electrical characteristics of the circuit thus formed in the outer periphery of the chip area, extensive information can be obtained in a short measuring time, so that the quality determination of the wafer or the chips can be effectively performed with high accuracy.

Further, this circuit can be formed on the dicing line in the outer periphery of the chip area and therefore, the wafer with this circuit is not reduced in the chip area as compared with a conventional wafer with no circuit like this. This circuit eliminates the need for forming a part of chips as a monitor element/circuit, for installing on a wafer a block having formed thereon a monitor element/circuit, or for forming a monitor element/circuit within a chip. Therefore, miniaturization of chip products or increase in the number of chips obtained from one wafer may be realized.

Further, when forming the circuit like this, a reticle for forming a monitor element/circuit is not required. Therefore, increase in the number of reticles or in the production cost of reticles, or increase in the number of production processes is suppressed. As a result, chips can be formed at low cost.

The circuit formed on a wafer can take a wide variety of forms by changing a monitor element/circuit or a connection state thereof. A case of forming various circuits using the reticle 1 will be described in detail below by giving specific examples.

First, a first embodiment will be described. In the first embodiment, a case of using a resistor as a monitor element will be described.

Figure 4:
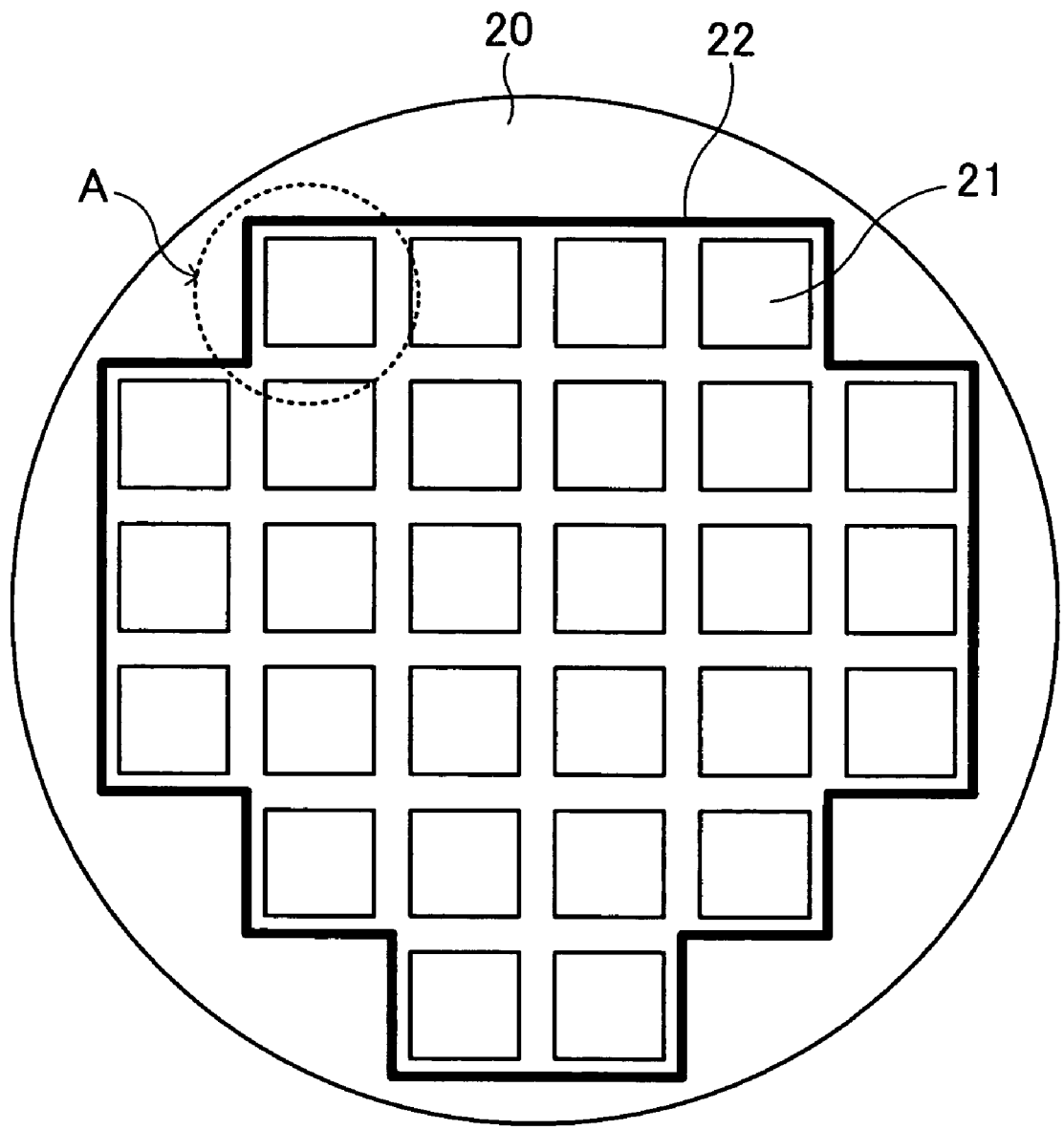
FIG. 4 is a schematic view of a circuit formation position on a wafer.

FIG. 4 is a schematic view of a circuit formation position on a wafer.

When using the above-described reticle 1, a circuit 22 including resistors is formed on a wafer 20 together with chips 21 so as to surround the whole formation area of the chips 21 on the wafer 20, as shown in FIG. 4. The circuit 22 is formed on a dicing line in an outer periphery of the whole formation area of the chips 21.

Figure 5:
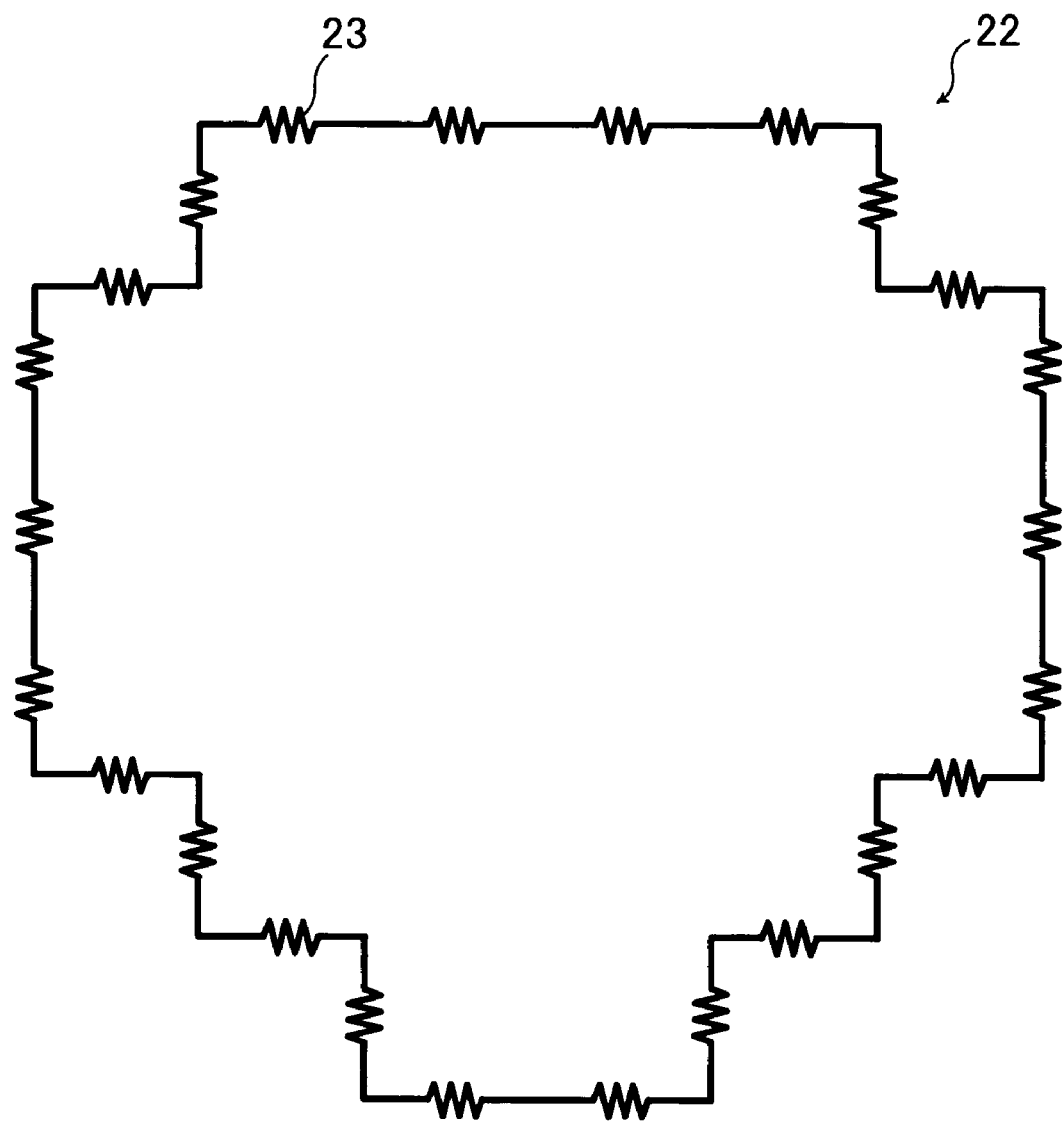
FIG. 5 is a circuit diagram in a case of using a resistor as a monitor element.

FIG. 5 is a circuit diagram in a case of using a resistor as a monitor element.

When using the resistor as the monitor element, there can be formed on the wafer 20 a circuit 22 including a plurality of resistors 23 serially connected, for example, as shown in FIG. 5. For the resistor 23, a conductor such as wiring materials or a p-type or n-type impurity diffusion layer can be used.

For the reticle 1, there is used a reticle having in the inner side area of each side in the area 4 a conductor or impurity diffusion layer used as the resistor 23 and a pattern for forming a wiring connected thereto as described above. By using the reticle 1 having such a construction, the circuit 22 which surrounds the whole formation area of the chips 21 can be formed as shown in FIG. 4.

When forming the circuit 22, the following reticles are employed. For example, when using a conductor as the resistor 23, there is employed one reticle 1 simultaneously having the monitor element/circuit area 4a and the monitor element/circuit connection areas 4b and 4c. By using the reticle 1 like this, exposure is performed, whereby the conductor may be finally formed on the wafer. When using an impurity diffusion layer as the resistor 23, there is employed one reticle 1 or two or more reticles 1 with the area 4a where a pattern for forming the impurity diffusion layer on the wafer is formed, or there is employed one reticle 1 or two or more reticles 1 with the areas 4b and 4c where a pattern for forming a contact hole or wiring connected to the impurity diffusion layer is formed. By using the reticle 1 like this, exposure is performed, whereby the contact hole or wiring may be finally formed on the wafer.

In a case of the circuit 22 including a plurality of resistors 23 thus connected serially, when having abnormality in any portion in the inside thereof, the circuit 22 indicates a resistance value different from that in a case where the whole circuit 22 is normally formed. When measuring the resistance value through the use of the above-described fact, quality determination of the wafer 20 or the chips 21 can be performed based on the measurement results.

Further, a terminal for the measurement may be formed on the thus formed circuit.

Figure 6:
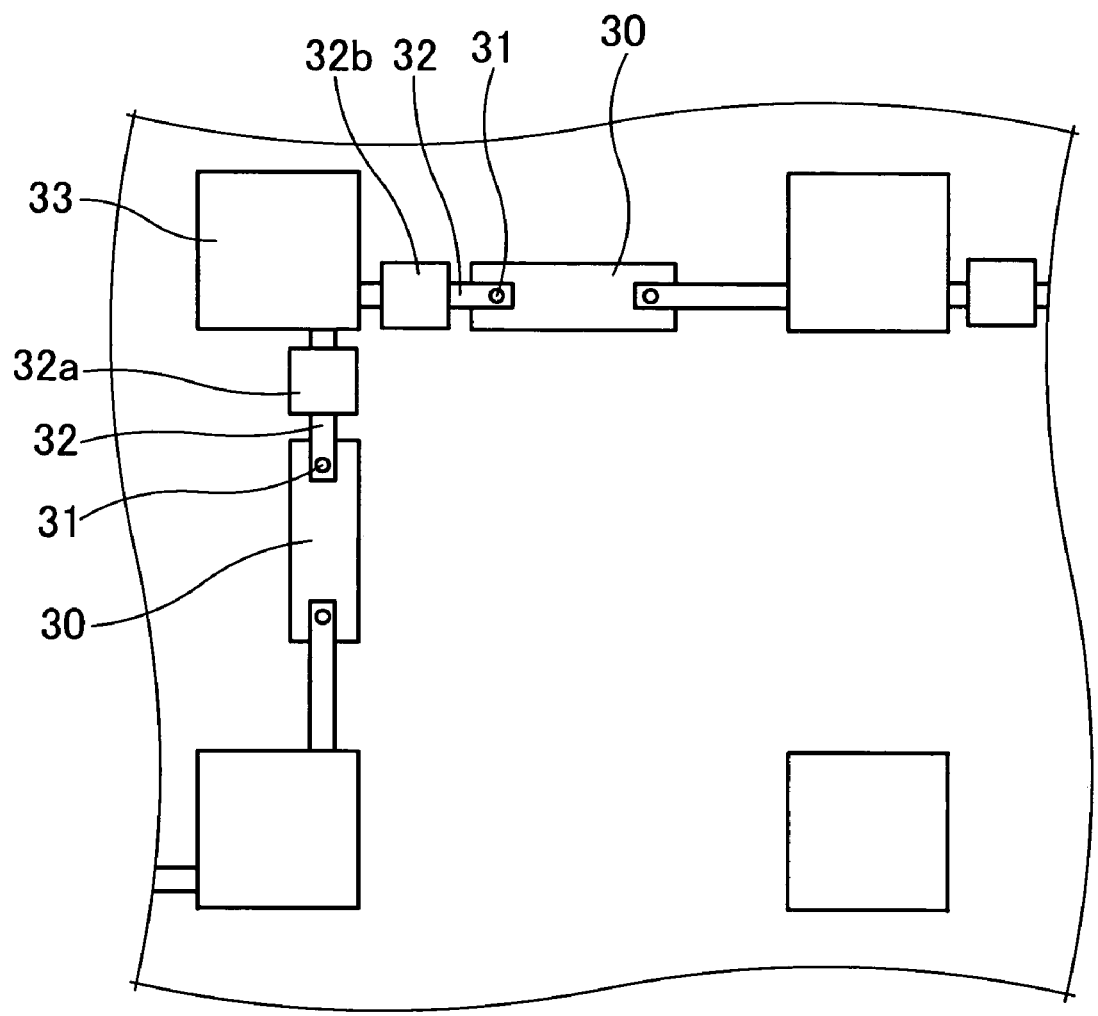
FIG. 6 is a schematic view showing an essential part (part one) of one example of a pattern formed on a wafer.
Figure 7:
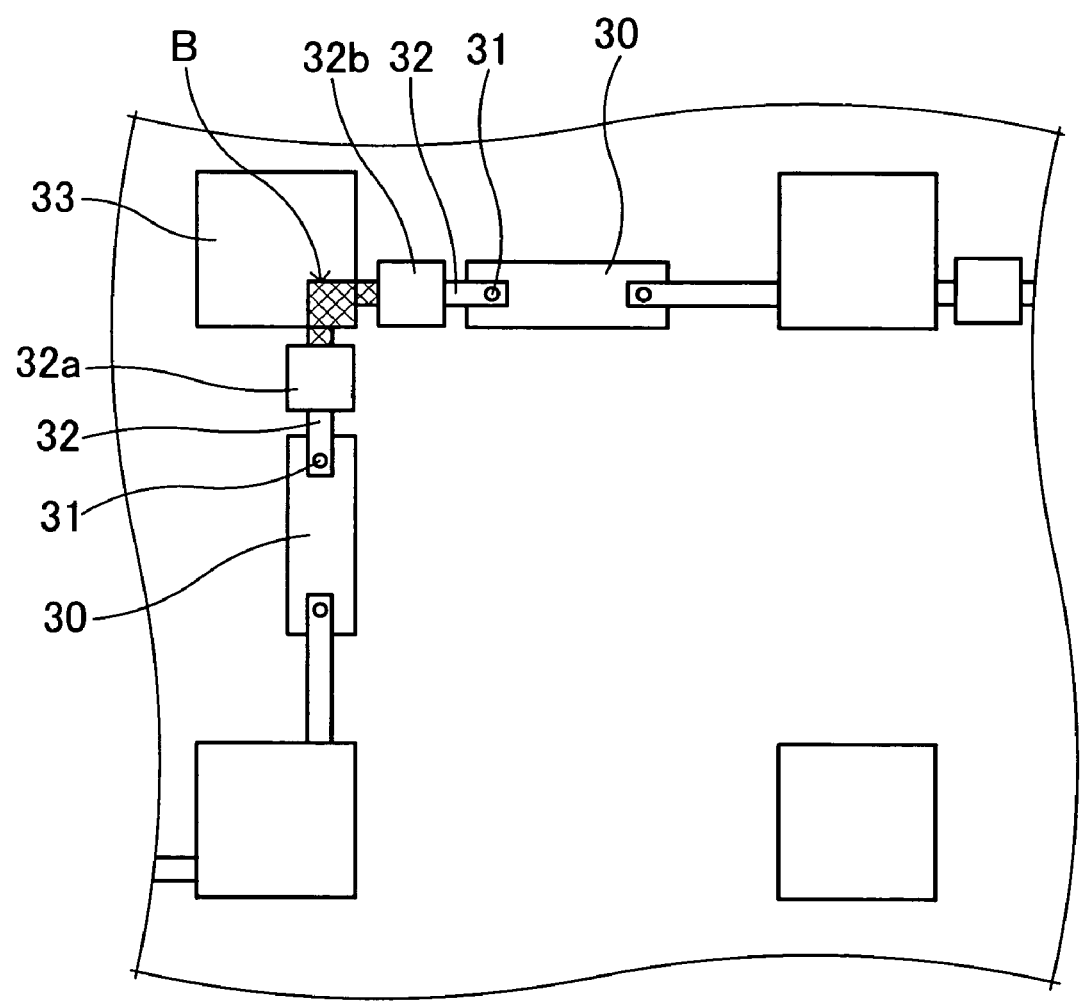
FIG. 7 is a schematic view showing an essential part (part two) of one example of a pattern formed on a wafer.

FIGS. 6 and 7 are schematic views showing an essential part of one example of a pattern formed on a wafer. Note, however, that FIGS. 6 and 7 correspond to an A site in FIG. 4.

For example, a case of using an impurity diffusion layer 30 as a monitor element will be described. On the wafer, a contact hole 31 which communicates with the impurity diffusion layer 30 is formed and thereon, wirings 32 and 33 connected to the contact hole 31 are formed as shown in FIG. 6. Herein, pads 32*a* and 32*b* are formed on the wiring 32.

For formation of the pattern like this, there are used a reticle 1 having in the inner side area of the outer peripheral dicing area 4 a pattern for forming the impurity diffusion layer 30, a reticle 1 having in the inner side area of the outer peripheral dicing area 4 a pattern for forming the contact hole 31, and a reticle 1 having, in the inner side area of the outer peripheral dicing area 4, patterns for forming the wirings 32 and 33 as well as the pads 32*a* and 32*b*. Alternatively, there is used a reticle 1 simultaneously having, in the inner side area of the outer peripheral dicing area 4, patterns for forming the contact hole 31, the wirings 32 and 33, and the pads 32*a* and 32*b*.

When using the reticle 1 like this, a circuit including the impurity diffusion layers 30 serially connected through the contact hole 31 and the wirings 32 and 33 is formed on the wafer together with chips so as to surround the whole formation area of the chips. In the thus formed circuit, for example, a part (a B site in FIG. 7) of the wirings 32 and 33 between the pads 32*a* and 32*b* at the circuit ends are removed by laser trimming, whereby a part of the circuit is disconnected as shown in FIG. 7.

Figure 8:
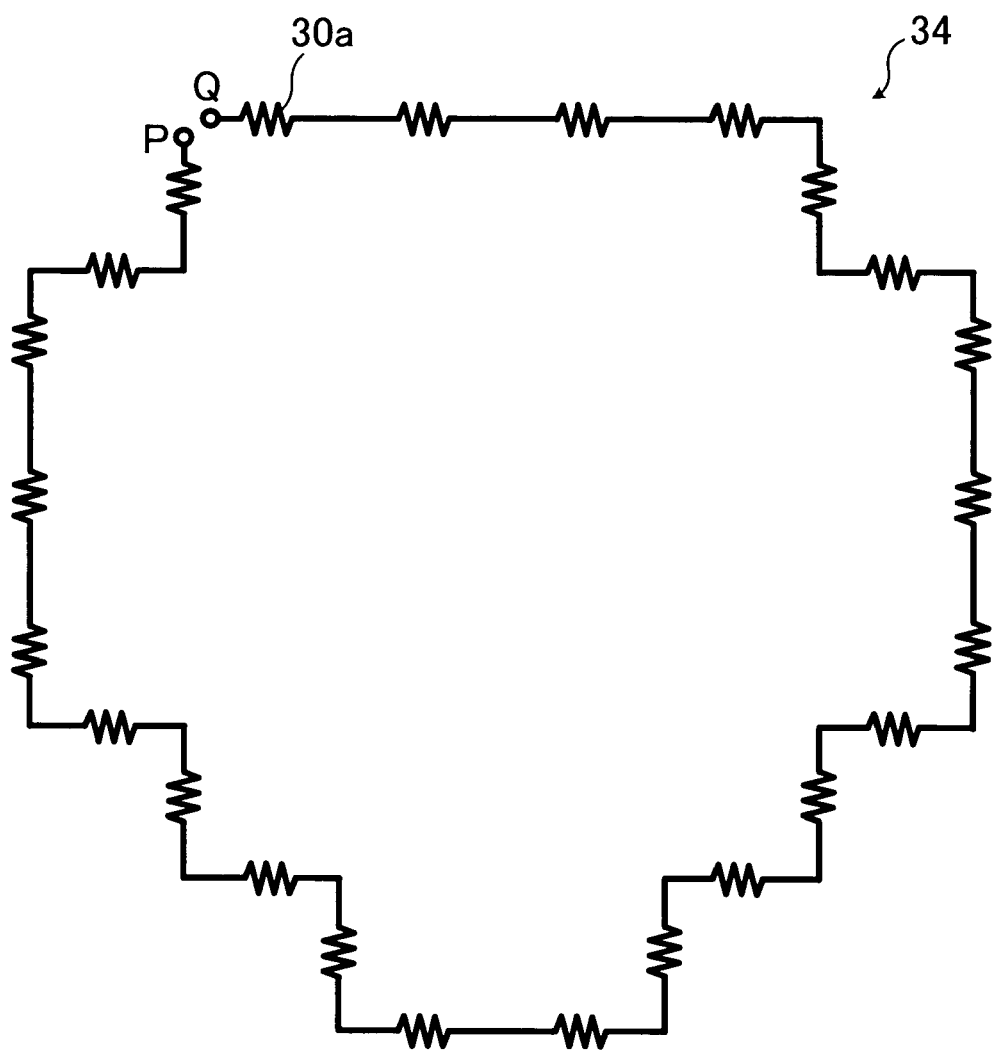
FIG. 8 is a circuit diagram in a case of disconnecting wirings between pads.

FIG. 8 is a circuit diagram in a case of disconnecting wirings between pads.

As shown in FIG. 7, when disconnecting the wirings 32 and 33 between the pads 32*a* and 32*b* at the circuit ends, there can be constructed a circuit 34 including a plurality of resistors 30*a* (corresponding to the impurity diffusion layers in FIGS. 6 and 7) serially connected between terminals P and Q (corresponding to between the pads 32*a* and 32*b* of FIGS. 6 and 7) as shown in FIG. 8. Accordingly, when measuring a resistance value between the terminals P and Q, quality determination of the wafer or the chips can be performed.

Herein, in order to form the terminals P and Q the wirings 32 and 33 between the pads 32*a* and 32*b* at the circuit ends are disconnected as shown in FIGS. 6 and 7. Further, the wirings 32 and 33 may be disconnected at an arbitrary one point or two or more points selected from the points where the pads 32*a* and 32*b* are formed. Herein, a case of using the impurity diffusion layer 30 as the monitor element is described by way of example. Also in the case of using a conductor such as a wiring as the monitor element, terminals can be of course formed similarly.

A case of using a resistor such as a conductor or an impurity diffusion layer as the monitor element is described above by way of example. Further, an inductor or a capacitor may be used in place of the resistor like this. In this case, a circuit including a plurality of inductors or capacitors serially connected is formed to surround the whole chip formation area on the wafer in the formation step of the chips. In the above circuit, when measuring impedance thereof, quality determination of the wafer or the chips can be performed based on the measurement results.

In addition, a diode can also be used as the monitor element. In this case, a circuit including a plurality of diodes serially connected is formed to surround the whole chip formation area on the wafer in the formation step of the chips. Note, however, that the moving direction of carriers in each diode is aligned in this case. In the above circuit, when measuring the total value of a forward voltage or reverse voltage of the circuit, quality determination of the wafer or the chips can be performed based on the measurement results.

Next, a second embodiment will be described. In the second embodiment, a case of using bipolar transistors or MOS transistors as the monitor element will be described. Also in the case of using these transistors, a circuit for measuring electric characteristics can be formed in response to the formation of chips using the reticle 1 as described above.

Figure 9:
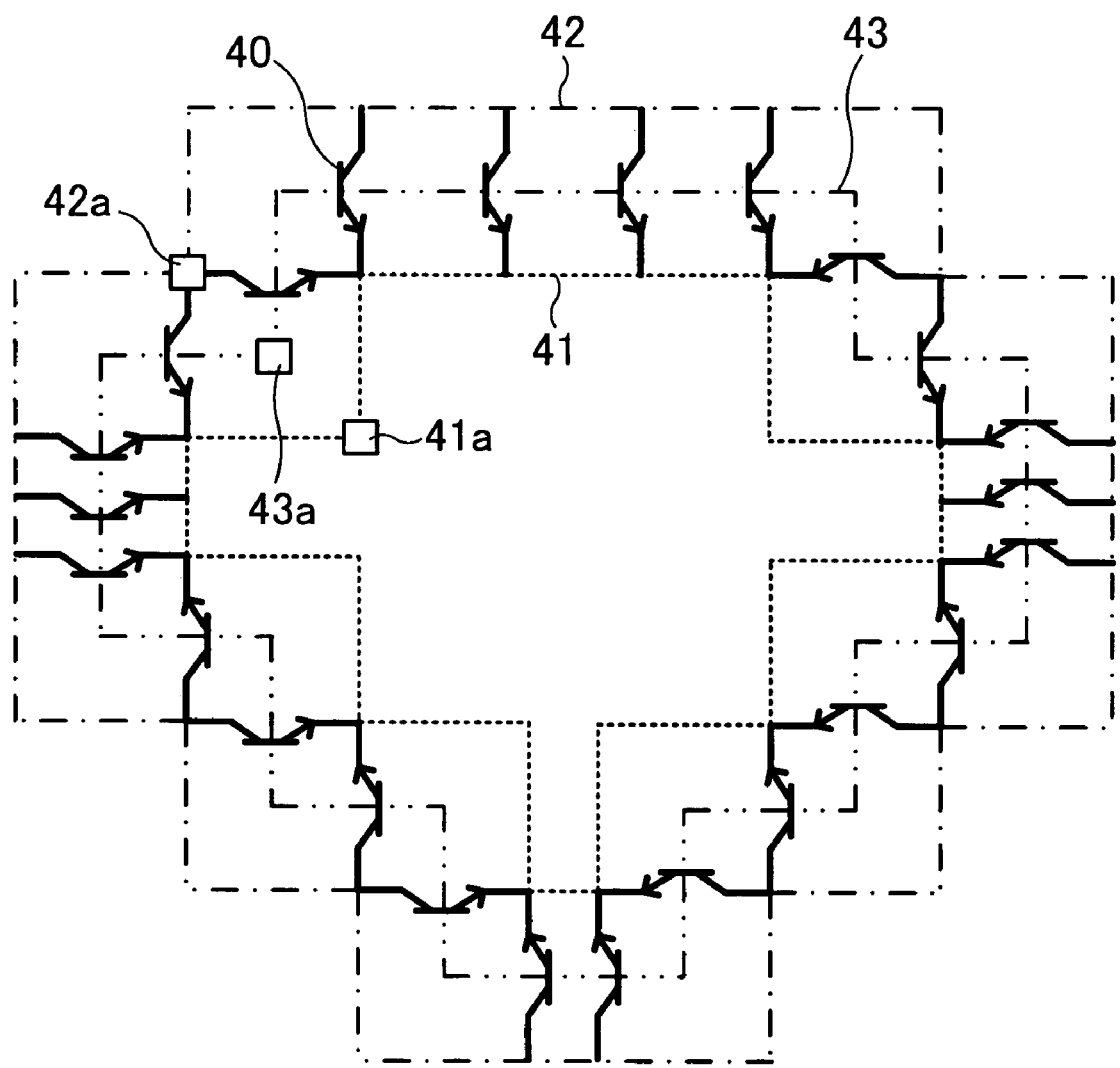
FIG. 9 is a circuit diagram in a case of using a bipolar transistor as a monitor element.

FIG. 9 is a circuit diagram in a case of using a bipolar transistor as the monitor element. Note, however, that in FIG. 9, a connection state between monitor elements is indicated by a broken line, a dashed line and a chain double-dashed line for the sake of convenience.

Herein, an npn-type bipolar transistor 40 is used as the monitor element. In each of the npn-type bipolar transistors 40, emitters, collectors and bases are connected by wirings 41, 42 and 43, respectively. In FIG. 9, the wiring 41 for connecting the emitters, the wiring 42 for connecting the collectors, and the wiring 43 for connecting the bases are indicated by the broken line, the dashed line and the chain double-dashed line, respectively.

The connection state like this can be formed, for example, by the following procedure. First, a plurality of the npn-type bipolar transistors 40 are formed on the dicing line in the outer periphery of the whole chip formation area on the wafer. Then, a first layer interlayer insulation film is formed in the outer peripheral dicing area. Further, a contact hole pattern which goes through the interlayer insulation layer to communicate with the emitters, collectors and bases of the respective npn-type bipolar transistors 40 is formed and moreover, a wiring pattern for connecting the emitters is formed on the contact hole pattern which communicates with the respective emitters. On this occasion, the contact hole pattern and the wiring pattern may be formed by any formation method using separate reticles 1 or using one reticle 1. Thereafter, wiring materials are buried in these patterns to thereby form a first layer wiring 41 for connecting the emitters. Further, at this time, wiring materials are buried also in the contact hole which communicates with the collectors and the bases.

Next, a second layer interlayer insulation film is formed in the outer peripheral dicing area. Then, a contact hole pattern which communicates with the wiring materials connected to the respective collectors and bases is formed. Further, a wiring pattern for connecting the collectors is formed on the contact hole pattern which communicates with the respective collectors. Thereafter, wiring materials are buried in these patterns to thereby form a second layer wiring 42 for connecting the collectors. At this time, wiring materials are buried also in the contact hole which communicates with the wiring materials connected to the bases.

Next, a third layer interlayer insulation film is formed in the outer peripheral dicing area. Then, a contact hole pattern which communicates with wiring materials connected to the respective bases is formed. Further, a wiring pattern for connecting the bases is formed on the contact hole pattern. Thereafter, wiring materials are buried in these patterns to thereby form a third layer wiring 43 for connecting the bases.

Finally, pads 41a, 42a and 43a are formed on the wirings 41, 42 and 43 of respective layers, respectively. The pads 41a, 42a and 43a are installed between the adjacent npn-type bipolar transistors 40, for example, on wirings of the uppermost layer.

Thus, the emitters, collectors and bases of the respective npn-type bipolar transistors 40 are connected through the wirings 41, 42 and 43, respectively. As a result, a circuit including a plurality of the npn-type bipolar transistors 40 connected in parallel is formed. In this circuit, when measuring electric characteristics, quality determination of the wafer or the chips can be performed based on the measurement results.

Herein, a case of using the npn-type bipolar transistor 40 as the monitor element is described by way of example. Also in the case of using a MOS transistor as the monitor element, the same circuit as described above can be formed. In this case, for example, a plurality of the MOS transistors are formed on the wafer. Thereafter, sources, drains and gates may be connected through the first layer wiring, the second layer wiring and the third layer wiring, respectively. Further, pads are installed on appropriate positions of the respective wirings. As a result, a circuit including the plurality of MOS transistors connected in parallel is formed.

Next, a third embodiment will be described. In the third embodiment, a case of using resistors, inductors, capacitors and diodes as the monitor element to construct a circuit including a plurality of monitor elements connected in parallel on the wafer will be described.

Using the reticle 1 as described above, the parallel circuit like this can be formed together with chips. More specifically, in the same procedures as in the second embodiment, a plurality of the predetermined monitor elements such as resistors are formed on the dicing line in the outer periphery of the whole chip formation area on the wafer. Thereafter, a first layer wiring for connecting one ends of the respective monitor elements, and a second layer wiring for connecting the other ends of the respective monitor elements are sequentially formed, whereby a multilayer wiring structure may be formed on the dicing line.

Also in a case of using the parallel circuit like this, when measuring electric characteristics of the circuit, quality determination of the wafer or the chips can be performed based on the measurement results.

Next, a fourth embodiment will be described. In the fourth embodiment, a case of using inverter circuits as the monitor circuit will be described.

Figure 10A:
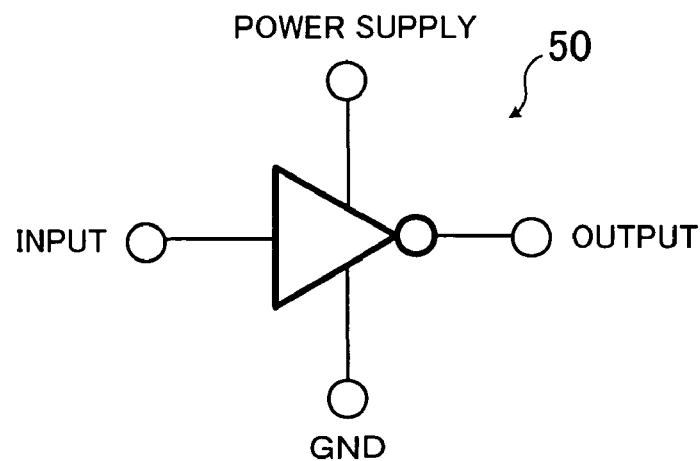
FIGS. 10A and 10B show a construction example of inverter circuits.
Figure 10B:
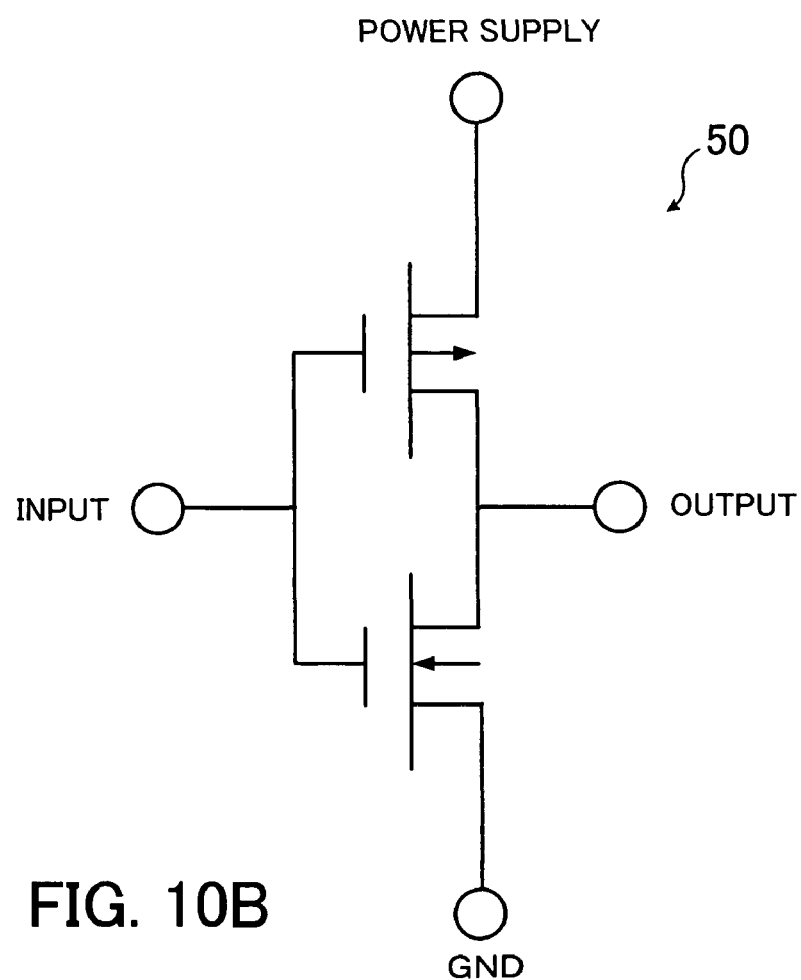

FIGS. 10A and 10B show a construction example of the inverter circuit.

On the dicing line in the outer periphery of the whole chip formation area on the wafer, for example, a plurality of inverter circuits 50 constructed using CMOS transistors are formed as shown in FIGS. 10A and 10B. On this occasion, an input section and output section of the inverter circuit 50 are aligned in one direction.

Figure 11:
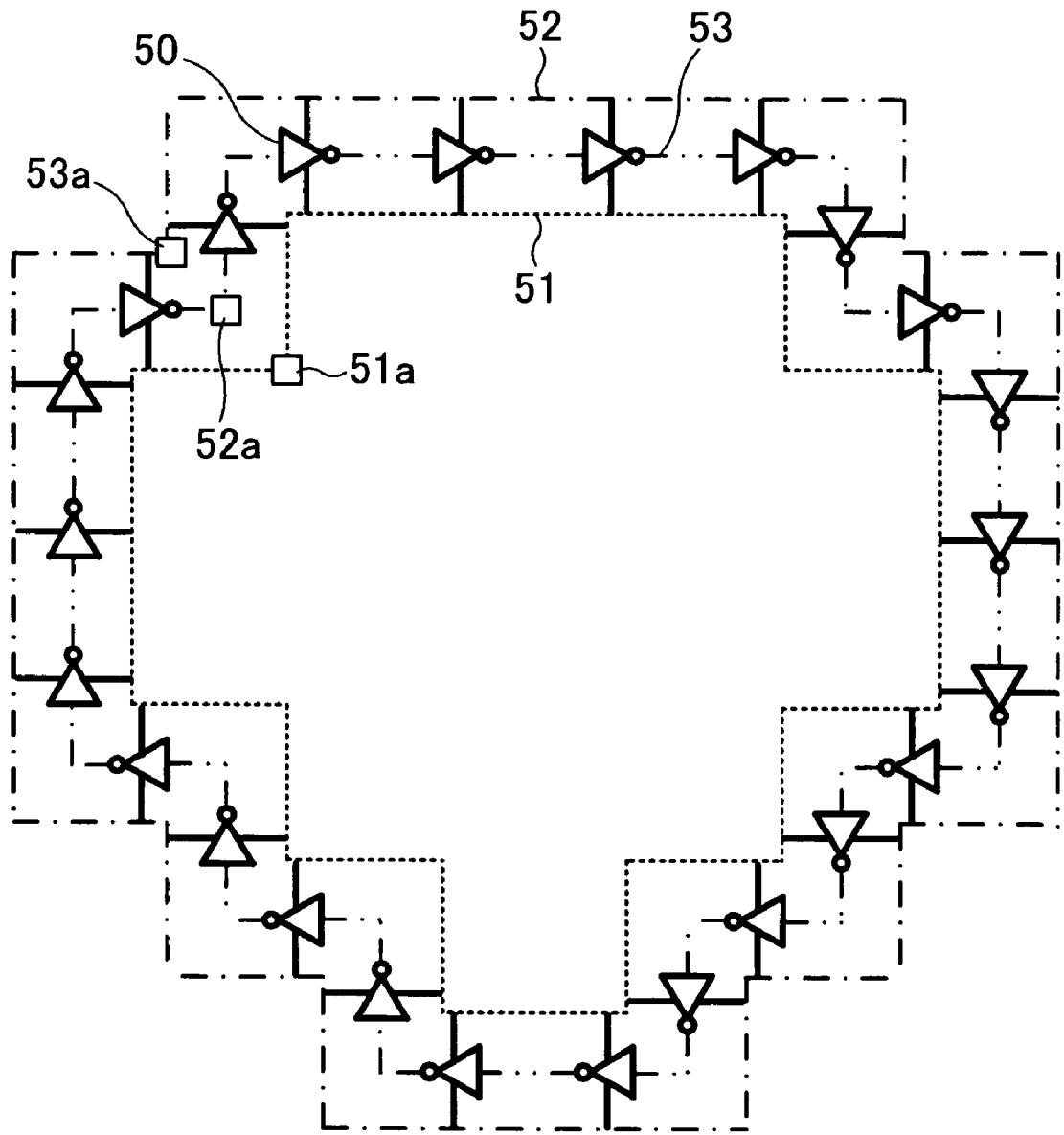
FIG. 11 is a circuit diagram in a case of using an inverter circuit as a monitor circuit.

FIG. 11 is a circuit diagram in a case of using inverter circuits as the monitor circuit. Note, however, that in FIG. 11, a connection state between monitor circuits is indicated by a broken line, a dashed line and a chain double-dashed line for the sake of convenience.

Herein, the inverter circuit 50 as shown in FIGS. 10A and 10B is used as the monitor circuit. In the same procedures as in the second embodiment, the circuit 50 is formed together with chips using the reticle 1. More specifically, a plurality of the inverter circuits 50 are formed on the dicing line in the outer periphery of the whole chip formation area on the wafer. Then, connection between the inverter circuits 50 is performed through the wirings 51, 52 and 53 of three layers.

More specifically, the ground (GND) sides between the inverter circuits 50 are connected through the first layer wiring 51, the power supply sides between the inverter circuits 50 are connected through the second layer wiring 52, and the input and output sections between the inverter circuits 50 are connected through the third layer wiring 53. In FIG. 11, the wiring 51 for connecting the GND sides, the wiring 52 for connecting the power supply sides, and the wiring 53 for connecting the input and output sections are indicated by the broken line, the dashed line and the chain double-dashed line, respectively.

After forming the inverter circuit 50 on the wafer, the wirings 51, 52 and 53 of three layers can be formed in the same procedures as in the second embodiment. Finally, pads 51a, 52a and 53a each connected to the wirings 51, 52 and 53 between the adjacent inverter circuits 50 are formed on wirings of the uppermost layer.

Thus, a plurality of the inverter circuits 50 are connected. As a result, a ring oscillation circuit is formed on the wafer so as to surround the whole chip formation area. In the circuit like this, when applying an appropriate voltage between the pad 51a connected to the GND side and the pad 52a connected to the power supply side, a signal having a specified frequency determined in response to the number or speed of the inverter circuit 50 is outputted to the pad 53a connected to the input and the output sections. When measuring the signal frequency or measuring the power supply current, quality determination of the wafer or the chips can be performed based on the measurement results.

Herein, a case of forming the inverter circuit 50 using the CMOS transistor is described by way of example. Also in the case of using a bipolar transistor, a MOS transistor or a resistor, the same inverter circuit as described above can be formed.

Next, a fifth embodiment will be described. In the fifth embodiment, a case of using as the monitor circuit an operational amplifier circuit in place of the inverter circuit 50 described in the fourth embodiment will be described. The operational amplifier circuit can be constructed using a bipolar transistor, a MOS transistor, a resistor or a capacitor.

In the same procedures as in the inverter circuit, the operational amplifier circuit is formed together with chips by using the reticle 1 as described above. More specifically, a plurality of the operational amplifier circuits are formed on the dicing line in the outer periphery of the whole chip formation area on the wafer. Then, connection between the operational amplifier circuits is performed through the wirings of three layers. On this occasion, an input section and output section of the operational amplifier circuit are aligned in one direction.

More specifically, the negative power supply sides between the operational amplifier circuits are connected through the first layer wiring, the positive power supply sides between the operational amplifier circuits are connected through the second layer wiring, and the input and output sections between the operational amplifier circuits are connected through the third layer wiring. Finally, pads each connected to the wirings of three layers between the adjacent operational amplifier circuits are formed on wirings of the uppermost layer.

Thus, a plurality of the operational amplifier circuits are connected. As a result, a multistage operational amplifier circuit is formed on the wafer so as to surround the whole chip formation area. For this multistage operational amplifier circuit, the third layer wiring for connecting the input and output sections of the respective operational amplifier circuits is disconnected at any one point using laser trimming, whereby both ends of the disconnected wiring can be served as the input section and output section of the multistage operational amplifier circuit. When measuring a power supply current, gain or offset voltage of this multistage operational amplifier circuit, quality determination of the wafer or the chips can be performed based on the measurement results.

As described above, when forming chips, the reticle 1 having the following construction is used. That is, the monitor element/circuit pattern 10 for forming the monitor element/circuit or the connection pattern 11*a* for connecting between the monitor elements/circuits is formed in the inner side area than the center of each side in the outer peripheral dicing area 4 as shown in FIGS. 1 to 3. When using the reticle 1 having the construction like this, the monitor element/circuit pattern 10 or the connection pattern 11*a* is not exposed on a portion in which the outer peripheral dicing areas 4 overlap on the resist, whereas the pattern 10 or the pattern 11*a* is exposed only on the dicing line in the outer periphery of the whole chip formation area, in which the outer peripheral dicing areas 4 do not overlap on the resist. As a result, a circuit which surrounds the whole chip formation area can be formed. When measuring the electric characteristics of the circuit, quality determination of the wafer or the chips can be performed. As described in the first to fifth embodiments, the circuit can take a wide variety of forms in response to types or connection states of the monitor element/circuit used.

Accordingly, since the circuit for measuring electric characteristics is formed on the dicing line in the outer periphery of the whole chip formation area on the wafer, an area capable of forming chips can be sufficiently secured. Further, according to the circuit like this, since extensive electric characteristics of the wafer can be simply measured in a short time, quality determination of the wafer or the chips can be easily and effectively performed.

Further, since the reticle 1 used in formation of chips is applied to the formation of the circuit like this, a reticle for forming a monitor element/circuit is not required. Therefore, increase in the number of reticles or in the production cost of reticles, or increase in the number of production processes is suppressed. As a result, chips can be formed at low cost.

Accordingly, a high-quality wafer or chip can be effectively formed at low cost.

In the present invention, in a step of forming a semiconductor device on a wafer, a circuit is formed in an outer periphery of a formation area of the semiconductor device so as to surround the area. As a result, when measuring electric characteristics of the circuit, extensive electric characteristics of the wafer can be simply measured in a short time and therefore, quality determination of the wafer or the semiconductor devices formed on the wafer can be easily and effectively performed. Further, this circuit can be formed, for example, on the dicing line in the outer periphery of the formation area of the semiconductor device on the wafer. Therefore, the formation area of the semiconductor device on the wafer can be sufficiently secured.

Further, a reticle used in formation of semiconductor devices can be applied to the formation of the circuit like this. Therefore, increase in the number of reticles or in the production cost of reticles, or increase in the number of production processes is suppressed. As a result, chips can be formed at low cost.

Accordingly, a high-quality wafer and semiconductor device can be effectively formed at low cost.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device manufacturing method, comprising:
    forming a resist over a wafer;
    performing a first exposure exposing a first shot position of the resist using a reticle including a first area and a second area in an outer periphery of the first area, the first area having first patterns for forming semiconductor chips, and the second area having second patterns for forming monitor elements or monitor circuits;
    performing a second exposure exposing a second shot position adjacent to the first shot position of the resist using the reticle so that the second area in the first exposure and the second area in the second exposure overlap with each other between the first shot position and the second shot position; and
    forming the semiconductor chips and a circuit enclosing all the semiconductor chips on the wafer, the formed circuit including the monitor elements or the monitor circuits electrically connected in series; wherein
    neither the monitor elements nor the monitor circuits are formed between the first area in the first exposure and the first area in the second exposure.

2. The method according to claim 1, further comprising:
    measuring electric characteristics of the formed circuit to thereby inspect the wafer.

3. The method according to claim 1, wherein the wafer is a wafer before dicing.

4. The method according to claim 1, wherein
    the second area in the first exposure and the second area in the second exposure are located on dicing lines of the wafer.

* * * * *